(12) United States Patent
Vaartstra

(10) Patent No.: US 6,348,412 B1
(45) Date of Patent: Feb. 19, 2002

(54) ORGANOMETALLIC COMPOUND MIXTURES IN CHEMICAL VAPOR DEPOSITION

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/708,310

(22) Filed: Nov. 7, 2000

Related U.S. Application Data

(62) Division of application No. 09/708,348, filed on Nov. 7, 2000, which is a division of application No. 09/067,801, filed on Apr. 28, 1998, now Pat. No. 6,159,855.

(51) Int. Cl.7 .......................... H01L 21/44; C23C 16/22
(52) U.S. Cl. .................. 438/681; 438/680; 427/255.28; 427/255.394
(58) Field of Search ................................ 438/681, 680; 427/255.28, 255.394

(56) References Cited

U.S. PATENT DOCUMENTS

| | | | |
|---|---|---|---|
| 4,895,709 A | 1/1990 | Laine | 423/344 |
| 5,003,092 A | 3/1991 | Beachley, Jr. | 556/1 |
| 5,139,825 A | 8/1992 | Gordon et al. | 427/225.394 |
| 5,178,911 A | 1/1993 | Gordon et al. | 427/225.394 |
| 5,192,589 A | 3/1993 | Sandhu | 427/225.394 |
| 5,204,314 A | 4/1993 | Kirlin et al. | 505/447 |
| 5,209,979 A | 5/1993 | Moehle et al. | 428/408 |
| 5,225,561 A | 7/1993 | Kirlin et al. | 546/256 |
| 5,280,012 A | 1/1994 | Kirlin et al. | 505/447 |
| 5,344,792 A | 9/1994 | Sandhu et al. | 438/660 |
| 5,362,328 A | 11/1994 | Gardiner et al. | 118/726 |
| 5,389,401 A | 2/1995 | Gordon | 427/255.36 |
| 5,399,379 A | 3/1995 | Sandhu | 427/255.391 |
| 5,409,735 A | 4/1995 | Winter et al. | 427/248.1 |
| 5,453,494 A | 9/1995 | Kirlin et al. | 534/15 |
| 5,478,610 A | 12/1995 | Desu et al. | 427/573 |
| 5,514,822 A | 5/1996 | Scott et al. | 556/28 |
| 5,527,567 A | 6/1996 | Desu et al. | 427/573 |
| 5,536,323 A | 7/1996 | Kirlin et al. | 118/726 |
| 5,559,260 A | 9/1996 | Scott et al. | 556/28 |
| 5,616,754 A | 4/1997 | Cruse et al. | 556/409 |
| 5,625,587 A | 4/1997 | Peng et al. | 365/145 |
| 5,637,527 A | 6/1997 | Baek | 438/396 |
| 5,924,012 A | * 7/1999 | Vaartstra | |
| 6,159,855 A | * 12/2000 | Vaartstra | 438/681 |

FOREIGN PATENT DOCUMENTS

EP 320 169 B1 6/1989

OTHER PUBLICATIONS

Hoffman, Chemical Vapor Deposition Of Nitride Thin Films, Elsevier Science,Ltd, 1994, pp. 1169–1179.*

Billingham and Jenkins, Polymerization Initiated By Titanium Amides, *Applied Polymer Symposia* 26:13–18, 1975.

Cathey, "Field Emission Displays," International Symposium on VLSI Technology Systems, and Applications, Proceedings of Technical Papers, May 31–Jun. 2, 1995, Taipei, Taiwan, 1995, pp. 131–136.

(List continued on next page.)

*Primary Examiner*—Alexander G. Ghyka
(74) *Attorney, Agent, or Firm*—Dorsey & Whitney

(57) ABSTRACT

Multi-metallic films are prepared from multi-metallic mixtures of metalloamide compounds. The mixtures are subjected to vaporization to form a multi-metallic vapor having defined and controllable stoichiometry. The multi-metallic vapor is then transferred to a chemical vapor deposition chamber, with or without the presence of a reactant gas, to form the multi-metallic film. Multi-metallic nitride, oxide, sulfide, boride, silicide, germanide, phosphide, arsenide, selenide, telluride, etc. films may be prepared by appropriate choice of metalloamide compounds and reactant gas(es).

20 Claims, 1 Drawing Sheet

OTHER PUBLICATIONS

Feingold and Katz, "Rapid thermal low-pressure metal-organic chemical vapor deposition (RT-LPMOCVD) of semiconductor, dielectric and metal film onto InP and related materials," *Materials Science and Engineering* R13(2):57–104, 1994.

Fix et al., "Synthesis of Thin Films by Atmospheric Pressure Chemical Vapor Deposition Using Amido and Imido Titanium (IV) Compounds as Precursors," *Chemistry of Materials* 2(3):225–241, 1990.

Hoffman, David M., "Chemical Vapour Deposition of Nitride Thin Films," *Polyhedron* 13(8):1169–1179, 1994.

* cited by examiner

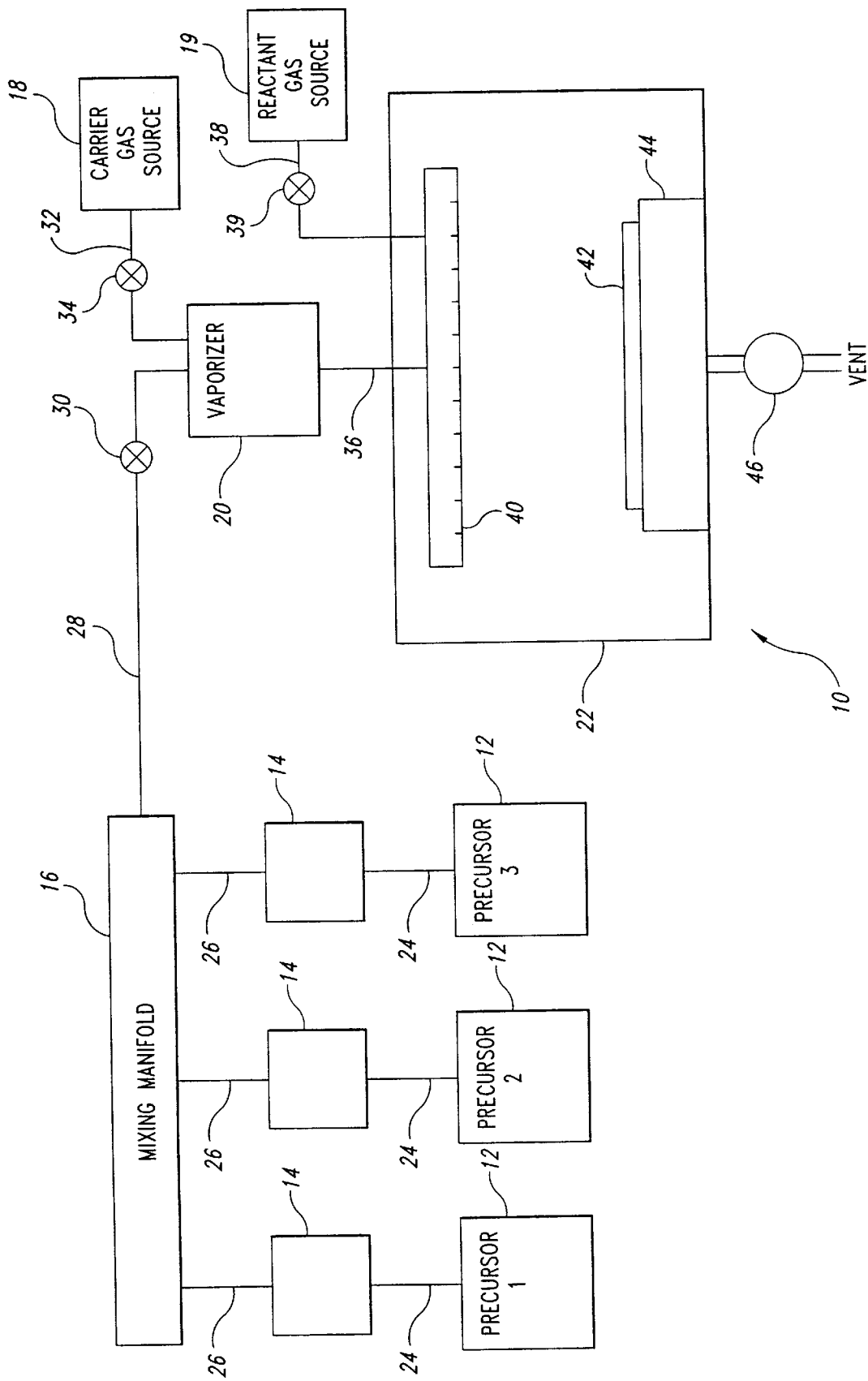

ORGANOMETALLIC COMPOUND MIXTURES IN CHEMICAL VAPOR DEPOSITION

CROSS-REFERENCE TO RELATED APPLICATION

This application is a divisional of pending U.S. patent application Ser. No. 09/708,348 filed Nov. 7, 2000, which is a divisional of U.S. patent application Ser. No. 09/067,801, filed Apr. 28, 1998, now U.S. Pat. No. 6,159,855.

FIELD OF THE INVENTION

This invention relates generally to chemical vapor deposition processes, and compositions useful therein, that may be used in semiconductor and other manufacturing technologies.

BACKGROUND OF THE INVENTION

Films containing two or more metals are generally known in the art, and may be referred to as multi-metallic films. A multi-metallic film may be formed from an alloy of two or more metals, and/or from one or more metal compounds, where a metal compound itself may contain more than one metal. Typical metal compounds are metal borides, nitrides, oxides and sulfides. Multi-metallic films find use in the semiconductor industry, and have been proposed for various special applications. For example, a $Ti_{1-x}Al_xN_2$ thin film has been proposed as a useful barrier layer which may be placed between a silicon substrate and an overlying metallization layer. While $Ti_{1-x}Al_xN_2$ films may be prepared by sputtering, that is a complicated process and is not well controlled in terms of metal stoichiometry, especially for via filling.

A thin film of a multi-metallic compound, such a $Ti_{1-x}Al_xN_2$, may be formed by flash vaporization of suitable precursor compounds, followed by deposition of the vapor according to a technique known as metalorganic chemical vapor deposition (MOCVD). In a typical MOCVD process, a heat decomposable metalorganic compound, which is commonly referred to as a "precursor" or "source reagent," is contacted with a substrate which has been heated to a temperature above the decomposition temperature of the precursor. Upon contact with the heated substrate, the precursor decomposes to form metallic species, which are then deposited onto a surface so as to form a metallic film or layer. This heat-induced decomposition process may be referred to as pyrolysis. In one version of the MOCVD process, the pyrolysis of the precursor occurs in the presence of a reactant gas so that a metallic compound is formed and then deposited onto a surface. By using more than one precursor, deposition of multi-metallic alloys and compounds is possible.

The semiconductor manufacturing industry has extensive expertise in the use of MOCVD, and employs this process in many production settings. MOCVD is a particularly advantageous process because it allows for strict control of the thickness of the formed layer, and also because a wide variety of substrate geometries may be coated. One example of a prior art apparatus for performing MOCVD is discussed in U.S. Pat. No. 5,399,379 entitled "Low-Pressure Chemical Deposition Process for Depositing High-Density, Highly-Conformal Titanium Nitride Films of Low Bulk Resistivity."

For many semiconductor manufacturing applications, obtaining and maintaining strict control over the stoichiometry of the deposited metallic or multi-metallic layer is paramount. That is, it is usually very important to deposit a metallic or multi-metallic layer such that the molar (or atomic) ratio of the different metals and/or other elements in the layer corresponds very closely to a predetermined value, or falls within a narrow specified range. The stoichiometry (i.e., numerical ratio of different metals and/or elements to one another) of the deposited layer can be strictly controlled if the precursors are delivered into the deposition chamber in a highly uniform and regulated manner. In other words, it is highly desirable to control the relative amounts of vaporized precursor molecules which are present in the deposition chamber of the MOCVD apparatus. The precursor delivery system is therefore an important component of the MOCVD process.

In one prior art precursor delivery system, one or more bubblers are used to deliver one or more precursors, in vapor form, into the deposition chamber. The bubblers are used in conjunction with a carrier gas stream which serves to dilute and deliver precursors into the deposition chamber. With the use of conventional bubblers, however, the gas phase ratio of different precursors in the deposition chamber tends to vary, especially when the number of precursors (and hence bubblers) is increased. As a result, conventional bubblers are not very effective at providing strict control over the composition of a vapor, and hence the composition of the deposited layer.

Flash vaporization has been described as one approach to achieving a controlled delivery of a precursor into a deposition chamber. See, e.g., U.S. Pat. No. 5,204,314, entitled "Method for Delivering an Involatile Reagent in Vapor Form to a CVD Reactor," and U.S. Pat. No. 5,536,323, entitled "Apparatus for Flash Vaporization Delivery of Reagents." As described in these patents, the delivery of a precursor vapor into the deposition chamber of a CVD apparatus may be accomplished by providing the precursor in a liquid form, either neat or in solution, and flowing the liquid onto a flash vaporization matrix structure which has been preheated to a temperature sufficient to flash vaporize the precursor source material. A carrier gas may optionally be flowed past the flash vaporization matrix structure to form a vapor mixture containing the carrier gas and the flash vaporized precursor or decomposition product(s) thereof. These precursor delivery systems, as described in the aforementioned patents, have addressed many of the problems associated with controlled delivery of precursors into deposition chambers.

Although MOCVD and flash vaporization are known in the art, these processes have not, to date, been effectively used to produce multi-metallic films having metal stoichiometries within tight specifications. Thus, there exists a need for processes that may be used to prepare multi-metallic films. The present invention addresses this need and provides further related advantages as described herein.

SUMMARY OF THE INVENTION

In one aspect, the present invention provides a composition that includes first and second metalloamide compounds. The first metalloamide compound comprises (i.e., has a structure which includes the structural unit) $M^1(NR^1R^2)$ and the second metalloamide compound comprises $M^2(NR^3R^4)$, wherein $M^1$ and $M^2$ are metals such that $M^1$ and $M^2$ are non-identical; N is nitrogen; and each of $R^1$, $R^2$, $R^3$ and $R^4$ is independently selected from hydrogen and organic groups. Here and throughout this disclosure, where the invention provides that at least first and second metalloamide compounds are present in a composition or method, the composition or method may contain or involve additional, e.g., third, metalloamide compounds.

In another aspect, the present invention provides a process for forming a source material, where the source material may be used in, for example, flash vaporization and/or chemical vapor deposition. The inventive process includes the steps of: providing a first metalloamide compound comprising the structural unit $M^1(NR^1R^2)$, where $M^1$ is a metal; N is nitrogen; and each of $R^1$ and $R^2$ is independently selected from hydrogen and organic groups; providing a second metalloamide compound comprising the structural unit $M^2(NR^3R^4)$, wherein $M^2$ is a metal; N is nitrogen; and each of $R^3$ and $R^4$ is independently selected from hydrogen and organic groups; and combining the first and second metalloamide compounds to form the source material.

In another aspect, the present invention provides a process for forming a multi-metallic vapor. The inventive process includes the steps of: providing a liquid multi-metallic mixture which includes first and second metalloamide compounds, where the first metalloamide compound contains a metal that is not present in the second metalloamide compound; and contacting the liquid multi-metallic mixture with a heated surface to vaporize the mixture and form the multi-metallic vapor.

In another aspect, the present invention provides a process for forming a multi-metallic layer on a substrate. The inventive process includes the steps of: providing a multi-metallic mixture that includes first and second metalloamide compounds, where the first metalloamide compound contains a metal that is not present in the second metalloamide compound; vaporizing the multi-metallic mixture by flash or other vaporization technique to form a multi-metallic vapor; and depositing at least a portion of the multi-metallic vapor onto a substrate to form a multi-metallic layer.

In another aspect, the present invention provides that in a chemical vapor deposition process for depositing gas-phase components onto a surface, the gas-phase components are formed by a process that includes vaporization of a multi-metallic mixture, wherein the multi-metallic mixture includes first and second metalloamide compounds, the first metalloamide compound containing a metal that is not present in the second metalloamide compound. The vaporization process is preferably a flash vaporization process.

In another aspect, the present invention provides a process for forming an electronic device. The inventive process includes the steps of: providing a multi-metallic mixture that includes, among other possible components, first and second metalloamide compounds, where the first metalloamide compound contains a metal that is not present in the second metalloamide compound; vaporizing the multi-metallic mixture, preferably by flash vaporization to form a multi-metallic vapor; depositing at least a portion of the multi-metallic vapor onto a substrate to form a multi-metallic layer; and utilizing the substrate having the multi-metallic layer, or a modified version thereof, as a component in an assembly, the assembly defining the electronic device.

These and related aspects of the present invention are described in more detail below.

BRIEF DESCRIPTION OF THE DRAWING

The FIGURE is a process diagram depicting a representative process for forming a multi-metallic layer on a substrate in accordance with an embodiment of the present invention.

DETAILED DESCRIPTION OF THE INVENTION

The present invention is generally directed to compositions which include at least two metalloamide compounds, and to a process for using the composition to form a multi-metallic layer on a substrate.

In one aspect, the invention provides a composition that includes at least two metalloamide compounds or, in other words, a composition that includes first and second metalloamide compounds. As used herein, a metalloamide compound is a metal-organic (also sometimes referred to as an organometallic) compound that includes a metal-nitrogen bond. Metalloamide compounds may also be referred to as metalloamine compounds. The term "metal" is used herein in its ordinary sense, that is, to refer to an electropositive chemical element characterized by ductility, malleability, luster, and conductivity of heat and electricity (see, e.g., Hackh's Chemical Dictionary, McGraw-Hill Book Company, 1944). Preferred metals of the present invention include transition metals and the metals found in Groups IA, IIA, IIIA and IVA of the Periodic Table.

Metals of Group IA of the Periodic Table are commonly known as alkaline metals, while metals of Group IIA of the Periodic Table are commonly known as alkaline earth metals, and include, for example, magnesium and calcium. Metals of Group IIIA of the Periodic Table are commonly referred to as earth metals, and include, for example, aluminum. Group IVA of the Periodic Table also includes metals, e.g., germanium, tin and lead. As used herein, the term "transition metal" means an element which has a partially or completely filled d or f shell in any of its commonly occurring oxidation states. The term encompasses elements of atomic number 21 through 30 (scandium through zinc), 39 through 48 (yttrium through cadmium), 57 through 79 (lanthanum through gold) and all elements from atomic number 89 (actinium) on. Preferred transition metals have atomic numbers within the ranges of 21–29, 39–47, and 72–79. Any of these metals may be present in a metalloamide compound that is useful in the present invention.

In a preferred embodiment of the present invention, the metal (M) is selected from elements of Group IIIA of the Periodic Table and transition metals. Aluminum is a preferred Group IIIA metal, and titanium is a preferred transition metal. A metalloamide compound as used herein may contain more than one metal, and when more than one metal is present in a metalloamide compound, those metals may be the same or different. However, at least one of those metals is directly bonded to at least one nitrogen atom. While the composition will necessarily contain at least two different metals, the composition may contain any number of metals, i.e., any number greater than two.

The nitrogen atom of the metalloamide compound is bonded to a metal as well as to two other atoms. Those two other atoms may either hydrogen or carbon, and are independently selected at each occurrence. In other words, the nitrogen atom of the metalloamide compound may be bonded to two hydrogen atoms, two carbon atoms, or one carbon and one hydrogen atoms, in addition to being bonded to a metal atom. Preferably, the nitrogen atom is bonded to two carbon atoms.

Thus, the metalloamide compounds of the present invention include the structural unit $M(NR_2)$ wherein M is a metal, N is nitrogen, and R is independently selected from hydrogen and carbon. When "R" is carbon, that carbon must be bonded to atoms in addition to the nitrogen atom, so that the "R" group is part of an organic group. In addition to carbon, the organic group may contain any number of silicon, nitrogen, oxygen and fluorine atoms, in addition to hydrogen atoms. The organic group is preferably a hydrocarbon group, that is, a group formed entirely from carbon and hydrogen.

In order that the metalloamide compound is sufficiently volatile to be vaporized, it is typically desirable that the organic or hydrocarbon group have no more than about 20 carbon atoms, preferably has from 1 to about 10 carbon atoms, and more preferably has 1 to about 5 carbon atoms. A preferred hydrocarbon group is an alkyl group, that is, a monovalent radical derived from an aliphatic hydrocarbon by removal of one hydrogen atom. Alkyl groups have the general formula $C_nH_{2n+1}$, where preferred alkyl groups of the present invention have 1 to 5 carbon atoms, i.e., are C1–C5alkyl groups. Methyl, ethyl, propyl (which, as used herein, includes the various propyl isomers including isopropyl and n-propyl), butyl (including the various butyl isomers) and pentyl (including the various pentyl isomers) are preferred alkyl groups. In general, metalloamide compounds having high vapor pressures are preferred.

Metalloamide compounds including alkyl groups may be referred to as metal alkylamino (or metal alkylamido) complexes, and when the amine group is substituted with two alkyl groups, the resulting compound may be referred to as a metal dialkylamino (or metal dialkylamido) complex. As used herein, the terms "compound" and "complex" have the same meaning, and the metal-organic compounds useful in the invention may be referred to either as metalloamide or metalloamine complexes. The inventive compositions and processes preferably employ metal dialkylamino complexes rather than metal alkylamino complexes because the dialkylamino complexes are typically less reactive in solution than the alkylamino complexes, and therefore compositions containing dialkylamino complexes have a longer shelf life.

In the case where the nitrogen atom of the metalloamide is bonded to two carbon atoms, those two carbon atoms may be bonded to one another to form a heterocyclic ring. For example, the nitrogen and two carbon atoms may, together with additional atoms, form a six-membered heterocyclic ring such as a piperidine ring.

A metal atom in a metalloamide compound may be bonded to more than just the $NR_2$ group described above. For example, the metal atom may be bonded to other nitrogen atoms, where those nitrogen atoms may, or may not, be part of an additional $NR_2$ group. Preferred metalloamide compounds of the present invention may be represented by the formula $M(NR_2)_x$ where x is an integer equal to the oxidation number of the metal. When a metalloamide compound contains more than one $NR_2$ group, two or more of those $NR_2$ groups may be bonded to one another (as long as each $NR_2$ group contains at least one carbon atom). In this case, the carbon atoms of different $NR_2$ groups may be bonded to one another through a chain of atoms, e.g., carbon, oxygen and/or nitrogen atoms. Thus, the metalloamide compound may include a multi-dentate nitrogen-containing ligand.

In addition to, or instead of, being bonded to one or more additional $NR_2$ groups, a metal atom of the metalloamide compound may be bonded to non-nitrogen atoms, e.g., carbon, oxygen, nitrogen, sulfur or other metal atoms. In order to enhance the volatility of the metalloamide compound, it is preferred that the total number of atoms in the metalloamide compound be less than about 100. In a preferred embodiment, the metalloamide compounds is formed entirely of metal, carbon, nitrogen and hydrogen atoms. In any event, a metalloamide compound of the present invention will contain the structural unit M-NR$_2$, in addition to possibly containing other structural units, where "structural units" may also be referred to as molecular fragments.

When the metalloamide compound contains more than one metal, the metalloamide compound may be represented by the structural unit $M_a(NR_2)_x$, where "a" represents the number of metal atoms in the metalloamide compound, and "x" represents the number of $NR_2$ groups in the metalloamide compound, where "x" equals at least 1 and may be sufficiently large that all open valence sites of the metal are satisfied by $NR_2$ groups.

Preferred metalloamide compounds of the present invention include, without limitation, compounds of the formula $M(NMe_2)_x$, where "Me" represents methyl ($CH_3$) and x represents the oxidation number of the metal. For example, when M is titanium (Ti) then x is 4 (four), and the compound is known as tetrakis(dimethylamido)titanium. Another preferred metalloamide compound of the invention has the formula $M_2(NMe_2)_x$, i.e., has two metal atoms and sufficient $NMe_2$ groups to satisfy the open valencies of the metal atoms. For example, when both M atoms are aluminum (Al), then x is 6 (six), as in the metalloamide compound of the formula $[Al(NMe_2)_3]_2$, also known as hexakis (dimethylamido)dialuminum.

Examples of metalloamide compounds (ie., metal amides) which may be present in the source material include, without limitation, hexakis-(dimethylamido)-dialuminum, hexakis-(methylamido)-dichromium, hexakis-(dimethylamido)-dichromium, hexakis-(ethylamido)-dichromium, hexakis-(diethylamido)-dichromium, hexakis-(methylethylamido)-dichromium, hexakis-(propylamido)-dichromium, hexakis-(isopropylamido)-dichromium, hexakis-(methylpropylamido)-dichromium, hexakis-(dipropylamido)-dichromium, hexakis-(butylamido)-dichromium, hexakis-(methylamido)-ditungsten, hexakis-(dimethylamido)-ditungsten, hexakis-(ethylamido)-ditungsten, hexakis-(diethylamido)-ditungsten, hexakis-(methylethylamido)-ditungsten, hexakis-(propylamido)-ditungsten, hexakis-(methylpropylamido)-ditungsten, hexakis-(ethylpropylamido)-ditungsten, hexakis-(butylamido)-ditungsten, hexakis-(methylamido)-dimolybdenum, hexakis-(dimethylamido)-dimolybdenum, hexakis-(ethylamido)-dimolybdenum, hexakis-(diethylamido)-dimolybdenum, hexakis-(methylethylamido)-dimolybdenum, hexakis-(iropylamido) dimolybdenum, hexakis-(methylpropylamido)-dimolybdenum, hexakis-(ethylpropylamido)-dimolybdenum, hexakis-(butylamido)-dimolybdenum, hexakis-(dibutylamido)-dimolybdenum, hexakis-(methylamido)-dimolybdenum, hexakis-(dimethylamido)-discandium, hexakis-(dimethylamido)-dititanium, hexakis-(dimethylamido)-divanadium, hexakis-(dimethylamido)-dimanganese, tetrakis-(diethylamido)-hafnium, tetrakis-(dimethylamido)-titanium, tetrakis-(dibutylamido)-titanium, tetrakis-(dimethylamido)-vanadium, tetrakis-(diethylamido)-zirconium, tetrakis-(dimethylamido)-zirconium, tetrakis-(diethylamido)-bis-($\mu$-ethylamido)-dizirconium, tetrakis-(diethylamido)-bis-($\mu$-ethylamido)-dirhodium, tetrakis-(diethylamido)-bis-($\mu$-ethylamido)-ditantalum, hexakis-(diethylamido)-tris-($\mu$-trimethylsilylamido)-dilanthanum, and hexakis-(diethylamido)-tris-($\mu$-trimethylsilylamido)-diactinium.

Metalloamide compounds are well known in the art, and may be either obtained from commercial sources or prepared by published synthetic routes. For instance, Aldrich Chemical Company (Milwaukee, Wis.) and Strem Chemical (Newburyport, Mass.) sell many metalloamide compounds including, without limitation, tetrakis(diethylamido) titanium, tetrakis(dimethylamido)-titanium, tetrakis (dimethylamido)zirconium and hexakis(dimethylamido)-dialuminum. Alternatively, as is appreciated by those skilled in the art, these metalloamide compounds may be prepared from lithium amides and the corresponding metal chlorides, or by reaction of a silylamide with a metal chloride or fluoride. See, e.g., U.S. Pat. No. 4,895,709, and references cited therein, which provides several synthetic procedures for metalloamide compounds.

Thus, the present invention provides a composition that includes first and second metalloamide compounds, where the first metalloamide compound includes the structural unit $M^1(NR^1R^2)$ and the second metalloamide compound includes the structural unit $M^2(NR^3R^4)$, wherein $M^1$ and $M^2$ are metals such that $M^1$ and $M^2$ are non-identical; N is nitrogen; and each of $R^1$, $R^2$, $R^3$ and $R_4$ is independently selected from hydrogen and organic groups. The term "$M^1$ and $M^2$ are non-identical" means that $M^1$ and $M^2$ represent different metals. Thus, there is at least one metal that is present in one of the metalloamide compounds (for example, the first metal compound) but that particular metal is not present in the other metalloamide compound (for example, the second metal compound). While $M^1$ and $M^2$ are non-identical metals, the $R^1$, $R^2$, $R^3$ and $R^4$ groups may be the same or different. Thus, the identity of any one of $R^1$, $R^2$, $R^3$ and $R^4$ is independent from the identity of any other of $R^1$, $R^2$, $R^3$ and $R^4$.

For the sake of clarity, it will be noted that while the metal content of the two metalloamide compounds will necessarily be different (because one metalloamide compound will contain a metal that is not present in the other metalloamide compound), since it is possible for a metalloamide compound to contain more than one metal, the two metalloamide compounds may have one or more metals in common. In addition, where the present invention provides that compositions include or comprise first and second metalloamide compounds, or that methods involve first and second metalloamide compounds, it is to be understood that the compositions and methods of the present invention may include or involve additional, ie., third, fourth, etc., metalloamide compounds. A third metalloamide compound may be identified as including the structural unit $M^3(NR^5R^6)$, while a fourth metalloamide compound may be identified as including the structural unit $M^4(NR^7R^8)$, and further metalloamide compounds may be identified in like manner.

The present invention provides processes for the formation of multi-metallic films. The precise chemical identity of the multi-metallic film will depend on the chemical identity of the metalloamide compounds, as well as the presence or absence of co-reactants. As discussed in detail below, the presence of reactive gases, such as boranes, silanes, ammonia, hydrogen, etc., will impact on the chemical identity of the multi-metallic film. Preferred compositions and processes of the present invention provide for the formation of titanium aluminum nitride, BST (barium strontium titanate), PZT (lead zirconium titanate), gallium arsenide, SBT (strontium bismuth tantalate), perovskite, nitride films containing at least two of aluminum, gallium and arsenic, various other ferroelectric films, among many others. Such multi-metallic films, albeit made by processes other than that of the present invention, are known in the art. See, e.g., U.S. Pat. Nos. 5,637,527; 5,625,587; 5,527,567; 5,514,882; 5,478,610; 5,389,401; 5,362,328; 5,280,012; and 5,225,561.

In another aspect, the present invention provides a process for forming a source material for chemical vapor deposition. The inventive process includes the steps of: providing a first metalloamide compound that includes, as part of its structure, the structural unit $M^1(NR^1R^2)$, where $M^1$ is a metal, N is nitrogen, and each of $R^1$ and $R^2$ is independently selected from hydrogen and organic groups; providing a second metalloamide compound that includes, as part of its structure, the structural unit $M^2(NR^3R^4)$, wherein $M^2$ is a metal, N is nitrogen, and each of $R^3$ and $R^4$ is independently selected from hydrogen and organic groups; and combining the first and second metalloamide compounds to form the source material. $M^1$ and $M^2$ are non-identical metals, however, $R^1$, $R^2$, $R^3$ and $R^4$ are the same or different, and the identity of any one of $R^1$, $R^2$, $R^3$ and $R^4$ is independent from the identity of any other of $R^1$, $R^2$, $R^3$ and $R^4$.

The inventive composition and source material may be prepared by combining the first and second metalloamide compounds and mixing them together. The first and second metalloamide compounds may be mixed together by hand, or by mechanical means. As explained in more detail below, a solvent may also be present in the inventive composition and source material. Thus, the first and second metalloamide compounds may be combined by mixing one or the other with a solvent, and then adding the remaining metalloamide compound(s) to the solvent/metalloamide mixture. For example, the metalloamide compounds and solvent(s) may be combined and the combination stirred or blended to achieve a homogeneous or heterogeneous mixture. A homogeneous mixture is generally preferred. If the metalloamide compounds do not readily dissolve in the solvent(s) at room temperature, then some heating may be applied to facilitate the dissolution process.

Each of the inventive composition and source material including first and second metalloamide compounds is preferably a fluid, ie., in liquid or gas phase. In instances where one or more of the metalloamide compounds is a solid at room temperatures and pressures, it is convenient to dissolve the metalloamide compounds in a suitable solvent in order to achieve a fluid form for the source material. Any solvent which may dissolve the metalloamide compounds may be used in the present invention. Preferably, the solvent is not reactive with the metalloamide compound, however, the formation of solvates between the metalloamide compound and the solvent is not necessarily undesirable.

Suitable solvents include, without limitation, aliphatic hydrocarbons (e.g., hexanes), preferably having three to twenty carbon atoms (i.e., C3–C20 aliphatic hydrocarbons), and more preferably being C5–C10 aliphatic hydrocarbons, aromatic hydrocarbons (e.g., benzene, toluene, xylene(s)), preferably C6–C20 aromatic hydrocarbons and more preferably C6–C10 aromatic hydrocarbons, ethers (e.g., diethyl ether, ethyl butyl ether), polyethers (e.g., polyethylene oxides), thioethers (e.g., dimethylsulfide), esters (e.g., ethyl acetate), ammonia, amines (e.g., triethylamine), polyamines (e.g. ethylenediamine and alkylated derivatives thereof), nitrites (e.g., acetonitrile), and silicone oils. All of these solvents are well known in the art, and may be obtained from many commercial supply houses including, for example, Aldrich Chemical Company (Milwaukee, Wis.). Preferred solvents are aliphatic and/or aromatic hydrocarbons, where toluene and xylene are suitable aromatic hydrocarbons.

Typically, the relative amounts of solvent and metalloamide compounds present in a mixture thereof does not greatly impact the practice of the present invention. As a preferred use for the inventive composition is as a source material for chemical vapor deposition, it is preferred to minimize the amount of solvent that needs to be vaporized. This is because the energy cost associated with volatilizing the composition will increase with increasing amounts of solvent in the composition. In addition, when the solvent is flammable, the flammability and hence safety concerns associated with using the composition increases as the solvent content increases. Thus, the presence of less solvent is generally preferred over the presence of more solvent, in the inventive compositions and processes. However, the amount of solvent should also be selected with a view to the desired concentration of metal species in the vapor.

The present invention also provides a process for forming a multi-metallic vapor. The process includes the steps of providing a liquid multi-metallic mixture which includes first and second metalloamide compounds, where the first metalloamide compound contains a metal that is not present in the second metalloamide compound; and contacting the liquid multi-metallic mixture with a heated surface to vaporize the mixture and form the multi-metallic vapor.

When the metalloamide compounds are themselves liquid at room temperature and pressure, then a liquid multi-metallic mixture that includes first and second metalloamide compounds can be readily provided by combining the metalloamide compounds as described above. However, in the more common case, one or both of the first and second metalloamide compounds will be solid at room temperature and pressure. With solid metalloamide compounds, a liquid multi-metallic mixture may be provided by combining the first and second metalloamide compounds in the presence of a solvent. Preferably, the solvent will completely dissolve each of the first and second metalloamide compounds, to provide a homogeneous solution.

The metalloamide mixture can be provided neat, or dissolved in a suitable solvent. The solvents that are suitable for this purpose include: aliphatic hydrocarbons, aromatic hydrocarbons, ethers, polyethers, thioethers, esters, ammonia, amines, polyamines, nitrites, silicone oils, or any combination thereof. Suitable solvents, and a process for providing a liquid multi-metallic mixture have been described above. In one preferred embodiment, the provided metalloamide mixture is made up of about 80–90 parts, and preferably 85 parts by weight of tetrakis-(dimethylamido)-titanium and about 10–20 parts, and preferably 15 parts by weight of hexakis-(dimethylamido)-dialuminum dissolved in toluene.

Regardless of how the liquid multi-metallic is provided or obtained, the invention includes the step of contacting the mixture with a heated surface. This contacting step imparts energy to the mixture, and causes the mixture to vaporize. The so-formed vapor will include at least two non-identical metals, and thus is referred to herein as a multi-metallic vapor.

The liquid multi-metallic mixture may be contacted with the heated surface by any effective means. For example, the mixture may be contacted in a dropwise manner, with the heated surface, by, for example, locating a reservoir of the liquid mixture above the heated surface, providing a small orifice in the reservoir through which the liquid mixture may escape in a dropwise manner, and allowing gravity to act on the droplets so to pull them down onto the heated surface. One possible reservoir for this purpose may be obtained from glassware manufacturers (e.g., Ace Glass or Knotes Glass, both of New Jersey) and is known as an addition or dropping funnel. Alternatively, the reservoir may be placed to the side of the heated surface, and a pump used to draw aliquots of liquid mixture from the reservoir into tubing, and then pass those aliquots through tubing followed by deposition of those aliquots onto the heated surface.

The heated surface which vaporizes the liquid mixture should be sufficiently hot that the mixture is vaporized, but should not be so hot that the mixture is undesirably decomposed. The precise temperature of the heated surface will depend on the identity of the liquid mixture. Some metalloamide compounds are more volatile than others, and the temperature of the heated surface should be sufficiently high that the least volatile metalloamide compound is vaporized. An appropriate temperature can be readily determined by contacting the mixture with a surface held at a relatively low temperature, e.g., 100° C., and observing whether the entire mixture rapidly vaporizes. If rapid vaporization is not observed, then the temperature of the heated surface may be raised in incremental fashion (e.g., in 20° C. increments) until a suitable temperature is obtained. Preferably, a temperature is selected which provides that all of the source material, including metalloamide compounds and solvent(s), is vaporized.

The present invention provides that the multi-metallic metalloamide mixture is subjected to vaporization so as to form a multi-metallic vapor. The vaporization process is preferably a flash vaporization process. As used herein, the term "flash vaporization" means vaporization of the metalloamide mixture wherein the period of time during which the vaporization takes place is sufficiently short such that the concentration of individual metalloamide compounds (i.e., precursors) in the metalloamide mixture is substantially the same as the concentration of individual metalloamide compounds in the resulting vapor. As is appreciated by those skilled in the art, flash vaporization occurs when the metalloamide mixture is transferred from its container, by liquid mass flow control techniques, and introduced onto a heated zone (also referred to as a flash vaporization matrix). The heated zone is to be maintained at an elevated temperature sufficient to flash vaporize the metalloamide mixture. In one preferred embodiment, the heated zone is maintained at approximately 100–200° C., so as to flash vaporize a mixture of tetrakis-(dimethylamido)-titanium and hexakis-(dimethylamido)-dialuminum dissolved in toluene.

After the metalloamide mixture has been vaporized, the resulting vapor is transferred via a conduit into a chemical vapor deposition chamber. A carrier gas is typically used to transport the metalloamide vapor from the heated zone into the deposition chamber. The carrier gases that are suitable for this purpose may include argon, helium, hydrogen, nitrogen, or any combination thereof. Preferably, argon is used as the carrier gas.

The metalloamide vapor is then contacted with a substrate, preferably an electronic device such as a semiconductor device, under conditions of chemical vapor deposition, to form a multi-metallic layer on the substrate. That is, the metalloamide vapor within the deposition chamber is exposed to a heated substrate on which deposition will occur. When the vapor within the deposition chamber includes tetrakis-(dimethylamido)-titanium and hexakis-(dimethylamido)-dialuminum, the substrate is suitably heated to a temperature within a range of 200 to 600° C., and preferably to a temperature of about 400° C. Furthermore, when the vapor includes tetrakis-(dimethylamido)-titanium and hexakis-(dimethylamido)-dialuminum, the pressure within the deposition chamber should be reduced to between 0.1 and 100 torr, and preferably to a pressure of about 0.5 torr.

The precise chemical composition of the deposited layer will depend not only on the composition of the source material, but may also be influenced by the presence of a reactant gas. As known in the art, and commonly practiced in chemical vapor deposition process, one or more reactant gases may be co-introduced into the deposition chamber to react with the source vapor, which in the present invention, is a multi-metallic metalloamide vapor.

Thus, a metallic compound, such as a nitride, oxide, sulfide, boride, silicide, germanide, phosphide, arsenide, selenide, telluride, etc. can be deposited on the substrate when an appropriate reactant gas is used. For example, a multi-metallic nitride can be deposited by reacting the metalloamide vapor with either ammonia or hydrazine. The use of ammonia may be particularly useful to prepare a film with less carbon content than is typically obtained using only an inert atmosphere (e.g., argon) as a carrier gas. Similarly, a multi-metallic oxide can be deposited by reacting the metalloamide vapor with oxygen, nitrous oxide, water vapor or ozone. In addition, a multi-metallic sulfide can be deposited by reacting the metalloamide vapor with hydrogen sulfide. Furthermore, a multi-metallic silicide can be deposited by reacting the metalloamide vapor with silane. Finally, a multi-metallic boride can be deposited by reacting the metalloamide vapor with diborane.

A reduction gas, such as hydrogen, may optionally be introduced into the deposition chamber to facilitate the deposition of a substantially pure multi-metallic layer. In one preferred embodiment, the multi-metallic layer formed on the substrate includes titanium. In another preferred embodiment, the substrate is a semiconductor device.

In one preferred embodiment, a multi-metallic layer of titanium aluminum nitride is formed on a semiconductor substrate. Specifically, a mixture made up of tetrakis-(dimethylamido)-titanium and hexakis-(dimethylamido)-dialuminum dissolved in toluene is provided. This metalloamide mixture is then subjected to vaporization, and preferably flash vaporization, so as to form a multi-metallic vapor. The multi-metallic vapor is then transferred into a chemical vapor deposition chamber, along with ammonia gas. The multi-metallic vapor with ammonia gas is contacted with the substrate under conditions of chemical vapor deposition to form the multi-metallic layer of titanium aluminum nitride.

Thus, in one aspect, the present invention is directed to a process for forming a multi-metallic layer on a substrate. The process for forming a metallic layer on a substrate includes the following steps. First, a mixture made up of at least two metalloamide compounds (i.e., at least two metal amide precursors) is provided in a suitable container. It is to be understood, however, that more than two metalloamide compounds may be combined to form the multi-metallic metalloamide mixture, so long as there are at least two different metal atoms present in the mixture. At least two of the metalloamide compounds of the provided mixture have the formulas $M^1(R^1R^2)$ and $M^2(R^3R^4)$, where each of $M^1$, $M^2$, N, $R^1$, $R^2$, $R^3$ and $R^4$ have been defined above.

Preferably, each of $M^1$ and $M^2$ is selected from the transition metals and aluminum. In addition, $R^1$, $R^2$, $R^3$ and $R^4$ are preferably alkyl radicals, and more preferably are selected from methyl, ethyl, propyl (where "propyl" includes all 3-carbon alkyl radicals) and butyl (where "butyl" includes all 4-carbon alkyl radicals). In one preferred embodiment, the provided metalloamide mixture includes tetrakis-(dimethylamido)-titanium and tetrakis-(dibutylamido)-titanium dissolved in toluene.

In another aspect, the process for forming a multi-metallic layer on a substrate may be carried out by using a tandem vaporization—chemical vapor deposition system. As illustrated by the embodiment shown in the Figure, vaporization—chemical vapor deposition system 10 may consist of a series precursor reservoirs 12, a series of associated liquid pumps 14, a mixing manifold 16, a carrier gas source 18, a reactant gas source 19, a vaporizer 20, and a chemical vapor deposition chamber 22. As shown, each precursor reservoir A2 (containing a selected metalloamide compound and/or solvent) is connected via first conduits 24 to corresponding liquid pumps 14. Each liquid pump 14, in turn, is connected to mixing manifold 16 via second conduits 26. Mixing manifold 16 serves to combine the individual metalloamide compounds into a multi-metallic mixture. The multi-metallic metalloamide mixture is then transferred to vaporizer 20 via third conduit 28. The flow rate of the metalloamide mixture within third conduit 28 is controllably regulated by first control valve 30. Similarly, the flow rate of a carrier gas from carrier gas source 18 is transferred into vaporizer 20 via fourth conduit 32 in a controllably regulated manner by second control valve 34.

Vaporizer 20 vaporizes the liquid metalloamide mixture. Preferably, vaporizer 20 achieves flash vaporization of the liquid metalloamide mixture. In any event, the resulting vapor along with the optional carrier gas is transferred via fifth conduit 36 into chemical vapor deposition chamber 22. In addition, a reactant gas from reactant gas source 19 may optionally be transferred via sixth conduit 38 into chemical vapor deposition chamber 22. The flow rate of the reactant gas is controllably regulated by third control valve 39. The transferred metalloamide vapor and reactant gas converge within chemical vapor deposition chamber 22 at shower head 40. Shower head 40 evenly disperses the vaporized multi-metallic metalloamide mixture within chemical vapor deposition chamber 22.

The vaporized multi-metallic metalloamide mixture impinges upon heated substrate 42 and decomposes thereon to form the desired multi-metallic layer. The temperature of heated substrate 42 is controllably regulated by internal heated chuck 44 (heated substrate 44 is on top of and in indirect contact with internal heated chuck 44). Finally, the pressure within chemical vapor deposition chamber 22 is controllably regulated by external pump 46. While the Figure illustrates an embodiment of the invention having three precursor reservoirs 12, the present invention provides that as few as two reservoirs may be present, with the precise number of reservoirs depending on the number of metalloamide compounds desirably delivered to the mixing manifold 16.

In another embodiment of the invention (not shown), a single precursor reservoir may contain a plurality of metalloamide compounds, so that a multi-metallic mixture is present with a precursor reservoir, in which case a mixing manifold may or may not be necessarily present in the system, depending on whether there are additional precursor reservoirs containing additional metalloamide compounds present in the system.

The present invention provides films that are particularly useful as components in an electronic device, e.g., a computer. Thus, in another aspect, the present invention is directed to a process for forming an electronic device. The process for forming an electronic device includes the following steps: providing a multi-metallic mixture that includes first and second metalloamide compounds, where the first metalloamide compound contains a metal that is not present in the second metalloamide compound; vaporizing the multi-metallic mixture to form a multi-metallic vapor; depositing at least a portion of the multi-metallic vapor onto a substrate to form a multi-metallic layer; and utilizing the substrate having the multi-metallic layer, or a modified version thereof, as a component in an assembly, the assembly defining the electronic device.

In one preferred embodiment, a titanium aluminum nitride layer is deposited as a barrier layer on semiconductor substrate, and the semiconductor substrate is then used as a component in a computer. The substrate having the multi-metallic layer is preferably utilized, or employed, by incorporating the substrate+layer into the electronic device, so that the layer serves as a component in the electronic device. The multi-metallic layer may serve, for instance, as a conductor or insulator in the electronic device, depending on the chemical identity of the layer.

The multi-metallic layer may be utilized in a modified form when it is present in the electronic device. Thus, as used herein, the term "utilizing the substrate having the multi-metallic layer, or a modified version thereof, as a component in an assembly, the assembly defining the electronic device" is specifically intended to encompass a process wherein the multi-metallic layer on the substrate, and/or the substrate itself, is modified in some way prior to, or after, being incorporated into the electronic device. For instance, the multi-metallic layer may be subjected to an etching process, or a chemical process which modifies the chemical identity of the originally formed multi-metallic layer on the substrate, or may be subjected to some other treatment or process step, prior to being incorporated into the electronic device. The present invention encompasses processes wherein at least a portion of a multi-metallic vapor as described herein is deposited onto a substrate to form a multi-metallic layer, and that substrate with the layer thereon is either directly used in the manufacture of an assembly for an electronic device, or is in some way altered and then indirectly used in the manufacture of an assembly for an electronic device.

The multi-metallic mixtures of the present invention are particularly suitable for use in flash vaporization and chemical vapor deposition processes. For example, the metalloamide compounds described above are compatible in mixtures. That is, they do not react with one another to form non-volatile species. Therefore, the mixture can be formed and stored in advance of it being used in a manufacturing process. This stability of the multi-metallic mixture is a paramount requirement of many manufacturing processes because an efficient manufacturing process depends on consistent starting materials, and if the starting materials react or decompose, then the process conditions will constantly need to be varied to respond to the changing identity of the starting (precursor) materials. High metal deposition rates to form a multi-metallic film are extremely difficult to achieve when the chemical constitution of the precursor material is changing due to reaction between the components. Thus, when preparing multi-metallic films, it is desirable but difficult to obtain precursor materials that are unreactive with one another, or only react to form volatile species. The present invention solves this problem.

In addition, the metalloamide compounds are versatile in that, by appropriate choice of a reactant gas, they can be used to form any of metal nitride, oxide, boride, sulfide, etc.—containing multi-metallic layers. Furthermore, the flash vaporization process requires liquid source materials, and because most metal compounds are solids, it is necessary that these metal compounds can be dissolved in a solvent. Many solid metalloamide compounds are readily soluble in a variety of solvents. Many metalloamide compounds are miscible with a variety of solvents in the cases where the metalloamide compound is itself a liquid. Thus, using metalloamide compounds, it is possible to prepare compositions of a suitable metal concentration and identity that are useful in flash vaporization and chemical vaporization processes.

As further advantages, many metalloamide compounds are easily vaporized and do not decompose during the flash vaporization process. These are important properties where vapors of precisely defined metal content are called for in a manufacturing process, which is the case in semiconductor manufacturing processes. Also, many metalloamide compounds are non-pyrophoric, and thus relatively safe to handle because they don't readily burn or combust.

All publications and patent applications mentioned in this specification are herein incorporated by reference to the same extent as if each individual publication or patent application was specifically and individually incorporated by reference.

From the foregoing, it will be appreciated that, although specific aspects and embodiments of the invention have been described herein for purposes of illustration, various modifications may be made without deviating from the spirit and scope of the invention. Accordingly, the invention is not limited except as by the appended claims.

I claim:

1. A process for forming a source material for chemical vapor deposition comprising the steps of:
    providing a first metalloamide compound comprising the structural unit $M^1(NR^1R^2)$, where $M^1$ is a metal; N is nitrogen; and each of $R^1$ and $R^2$ is independently selected from hydrogen and organic groups;
    providing a second metalloamide compound comprising the structural unit $M^2(NR^3R^4)$, wherein $M^2$ is a metal; N is nitrogen; and each of $R^3$ and $R^4$ is independently selected from hydrogen and organic groups, where the first metalloamide compound contains a metal that is not present in the second metalloamide compound, and at least one metal in the first or second metalloamide compound is a non-Group III metal; and
    combining the first and second metalloamide compounds to form the source material.

2. The process of claim 1 wherein the organic group is a hydrocarbon.

3. The process of claim 2 wherein the hydrocarbon is selected from methyl, ethyl, propyl, and butyl.

4. The process of claim 1 further comprising the step of combining at least one metalloamide compound with a solvent.

5. The process of claim 4 wherein the solvent is selected from the group consisting of aliphatic hydrocarbons, aromatic hydrocarbons, ethers, polyethers, thioethers, esters, ammonia, amines, polyamines, nitrites, and silicone oils.

6. The process of claim 1 wherein the source material comprises tetrakis-(dimethylamido)-titanium and hexakis-(dimethylamido)-dialuminum.

7. A process for forming a multi-metallic vapor comprising the steps of:
    providing a liquid multi-metallic mixture comprising first and second metalloamide compounds, where the first metalloamide compound contains a metal that is not present in the second metalloamide compound, and at least one metal in the first or second metalloamide compound is a non-Group III metal; and
    contacting the liquid multi-metallic mixture with a heated surface to vaporize the mixture and form the multi-metallic vapor.

8. The process of claim 7 wherein the first and second metalloamide compounds each comprise the structural unit $M(NR_2)$ where M is a metal, N is nitrogen and R is independently selected from hydrogen and carbon.

9. The process of claim 7 wherein the first metalloamide compound comprises the structural unit $M^1(NR^1R^2)$ where $M^1$ is a metal, N is nitrogen and each of $R^1$ and $R^2$ is independently a hydrocarbon group.

10. The process of claim 9 wherein the hydrocarbon group is a C1–C5alkyl group.

11. The process of claim 7 wherein the second metalloamide compound comprises the structural unit $M^2(NR^3R^4)$ where $M^2$ is a metal, N is nitrogen and each of $R^3$ and $R^4$ is independently a hydrocarbon group.

12. The process of claim 7 wherein at least two different metals selected from the group consisting of transition metals and the metals present in Groups IA, IIA, IIIA and IVA of the Periodic Table are present in the mixture.

13. The process of claim 12 wherein the group consists of transition metals and the metals present in Group IIIA of the Periodic Table.

14. The process of claim 7 wherein the mixture comprises aluminum and titanium.

15. The process of claim 7 wherein the mixture further comprises a third metalloamide compound.

16. The process of claim 7 wherein the multi-metallic mixture further comprises a solvent.

17. The process of claim 16 wherein the solvent is selected from the group consisting of aliphatic hydrocarbons, aromatic hydrocarbons, ethers, polyethers, thioethers, esters, ammonia, amines, polyamines, nitrites, and silicone oils.

18. The process of claim 16 wherein the solvent is an aliphatic or aromatic hydrocarbon.

19. The process of claim 7 wherein the mixture comprises tetrakis(dimethylamido)titanium and hexakis(dimethylamido)dialuminum.

20. The process of claim 7 wherein the liquid multi-metallic mixture is vaporized by flash vaporization to form the multi-metallic vapor.

* * * * *

UNITED STATES PATENT AND TRADEMARK OFFICE
CERTIFICATE OF CORRECTION

PATENT NO.      : 6,348,412 B1
DATED           : February 19, 2002
INVENTOR(S)     : Brian A. Vaartstra It is certified that error appears in the above-identified patent and that said Letters Patent is hereby corrected as shown below:

<u>Title page,</u>
Item [62], Related U.S. Application Data,
Correct the following information, which reads:
"Division of application No. 09/708,348, filed on November 7, 2000, which is a divisional of application No. 09/067,801, filed on Apr. 28, 1998, now Pat. No. 6,159,855."
and should read:
-- Division of application No. 09/067,801, filed on Apr. 28, 1998, now Pat. No. 6,159,855. --
OTHER PUBLICATIONS,
Delete in the first citation:
"Hoffman, Chemical Vapor Deposition of Nitride Thin Films, Elsevier Science, Ltd., 1994, pp. 1169-1179."

<u>Column 14,</u>
Line 45, reads "nitrites" should read -- nitriles --

<u>Column 16,</u>
Line 6, reads "nitrites" should read -- nitriles --

Signed and Sealed this

Second Day of July, 2002

Attest:

Attesting Officer

JAMES E. ROGAN
Director of the United States Patent and Trademark Office